(12) United States Patent
Tsunomura et al.

(10) Patent No.: US 8,153,884 B2
(45) Date of Patent: Apr. 10, 2012

(54) SOLAR CELL MODULE

(75) Inventors: Yasufumi Tsunomura, Takasago (JP);
Yukihiro Yoshimine, Kobe (JP);
Haruhisa Hashimoto, Minoh (JP)

(73) Assignee: Sanyo Electric Co., Ltd., Moriguchi (JP)

( * ) Notice: Subject to any disclaimer, the term of this patent is extended or adjusted under 35 U.S.C. 154(b) by 420 days.

(21) Appl. No.: 12/183,179

(22) Filed: Jul. 31, 2008

(65) Prior Publication Data

US 2009/0038675 A1    Feb. 12, 2009

(30) Foreign Application Priority Data

Aug. 7, 2007  (JP) ................ 2007-204994

(51) Int. Cl.
*H01L 31/042* (2006.01)
(52) U.S. Cl. ........................................ 136/244
(58) Field of Classification Search .......... 136/244
See application file for complete search history.

(56) References Cited

U.S. PATENT DOCUMENTS

| | | |
|---|---|---|
| 5,183,969 A | 2/1993 | Odashima |
| 6,121,542 A * | 9/2000 | Shiotsuka et al. ............. 136/256 |
| 2004/0200522 A1 | 10/2004 | Fukawa et al. |
| 2007/0095387 A1* | 5/2007 | Fujii et al. ..................... 136/251 |

FOREIGN PATENT DOCUMENTS

| | | | | |
|---|---|---|---|---|
| JP | 4-145180 A | 5/1992 | | |
| JP | 04145180 A | * 5/1992 | ............. | 523/461 |
| JP | 2000-261012 A | 9/2000 | | |
| JP | 2004-281800 A | 10/2004 | | |
| JP | 2005-101519 A | 4/2005 | | |

* cited by examiner

*Primary Examiner* — Alexa Neckel
*Assistant Examiner* — Miriam Berdichevsky
(74) *Attorney, Agent, or Firm* — Marvin A. Motsenbocker; Mots Law, PLLC

(57) ABSTRACT

A solar cell module is provided that comprises: a solar cell; a connection electrode provided on each of a light-receiving surface and back surface of the solar cell; a conductive resin adhesive arranged on an upper surface of the connection electrode; and a wiring material electrically connected to the solar cell and connected with the connection electrode and the conductive resin adhesive, wherein the conductive resin adhesive changes color upon curing, and the conductive resin adhesive on the upper surface of the connection electrode provided on the light-receiving surface of the solar cell is arranged within a region corresponding to at least one of the connection electrode and the wiring material, on a projection plane parallel with the light-receiving surface and exposed on a light-receiving surface side.

17 Claims, 20 Drawing Sheets

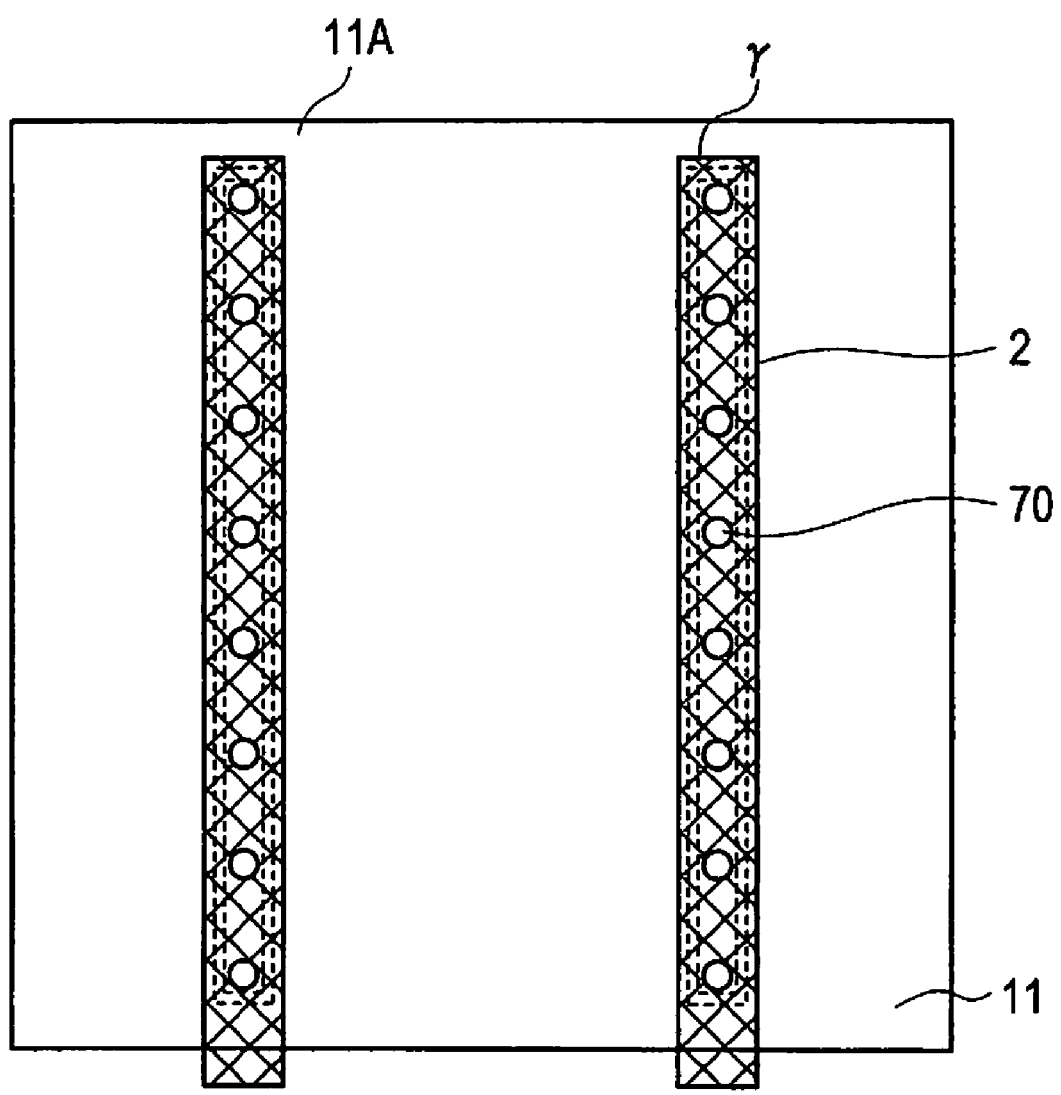

SOLAR CELL MODULE

CROSS REFERENCE TO RELATED APPLICATIONS

This application claims priority based on 35 USC 119 from prior Japanese Patent Application No. P2007-204994 filed on Aug. 7, 2007, the entire contents of which are incorporated herein by reference.

BACKGROUND OF THE INVENTION

1. Field of the Invention

The present invention relates to a solar cell module including multiple solar cells electrically connected with one another by wiring.

2. Description of Related Art

A conventional solar cell module has a configuration in which multiple solar cells are sealed between a front surface protection member and a back surface protection member by a sealant. The multiple solar cells are electrically connected with one another by wiring.

Heretofore, it is known to use conductive resin adhesive when wiring materials are connected to solar cells. With this method, a bonding temperature at which the wiring materials are bonded to the solar cells can be lowered when compared to the use of solder. Thereby, thermal effect on the solar cells can be reduced. This method is disclosed in, for example, Japanese Patent Laid-open Publication No. 2005-101519.

In addition, it has been known that a coloring function from curing is imported to the resin adhesive to check the curing of the adhesive, as disclosed in, for example, Japanese Patent Laid-open Publication No. Hei. 4-145180.

Conventional conductive resin adhesives having a function to be colored include a paste-like one and a tape-like one in a state where it is not cured.

In the case of the paste-like resin adhesive, the degree of spread of the paste at the time of bonding changes depending on a viscosity of the paste, displacement of the paste at the time of application, and variations in the application amount. On the other hand, in the case of the tape-like conductive resin adhesive, the degree of spread of the tape at the time of bonding changes depends on variations in position where the tape is placed and hardness of the tape.

Curing of the conductive resin adhesive includes a thermo-compression bonding process in which pressure is applied to the conductive resin adhesive while heat is applied thereto at the same time. The degree of spread of the conductive resin adhesive also changes depending on variations in heat and pressure applied to the conductive resin adhesive at this time.

In the above-described bonding methods, the colored conductive resin adhesive can protrude from a space between a connection electrode and a wiring material to a light-receiving surface of a solar cell, due to a state of the conductive resin adhesive and variations in bonding method. There arises a problem that an output of a solar call module decreases because a power generation effective area is shielded when the colored conductive resin adhesive protrudes to the light-receiving surface as described above.

In addition, when the conductive resin adhesive is designed to prevent protrusion from a tab to prevent the above-described problem, it becomes difficult to check the coloring of the conductive resin adhesive by curing.

The above-described problem is commonly caused when a connection electrode of a solar cell and the solar cell are bonded to each other by a conductive resin adhesive and also when a connection electrode of a solar cell and a wiring material that takes out electricity are bonded to each other by a conductive resin adhesive.

SUMMARY OF THE INVENTION

An aspect of the invention provides a solar cell module that comprises: a solar cell; a connection electrode provided on each of a light-receiving surface and a back surface of the solar cell; a conductive resin adhesive arranged on an upper surface of the connection electrode; and a wiring material connected with the connection electrode by the conductive resin adhesive to be electrically connected to the solar cell, wherein the conductive resin adhesive changes colored by curing, and the conductive resin adhesive on the upper surface of the connection electrode provided on the light-receiving surface of the solar cell is arranged within a region corresponding to at least one of the connection electrode and the wiring material on a projection plane parallel with the light-receiving surface and protrudes to a light-receiving surface side.

According to the above-described aspect, the conductive resin adhesive is arranged within the region corresponding to at least one of the connection electrode and the wiring material on the projection plane parallel with the light-receiving surface. Thereby, the decrease of an output of the solar cell module due to the exposure of the conductive resin adhesive to the light-receiving surface can be prevented. Furthermore, the conductive resin adhesive is arranged so as to protrude to the light-receiving surface side. Thereby, the color change of the conductive resin adhesive by curing can be visually recognized from the light-receiving surface side. Thus, the curing of the conductive resin adhesive can be easily checked.

Here, the above-described wiring material may have an opening or a notch, from which the conductive resin adhesive protrudes. Thereby, the curing of the conductive resin adhesive can be easily checked through the opening or notch.

In addition, the above-described conductive resin adhesive may be provided within a surface on the connection electrode side of the wiring material and cover side surfaces of the connection electrode. Thereby, the connection electrode can be further strengthened.

Moreover, the conductive resin adhesive may be arranged so as to protrude from the wiring material within a surface on the wiring material side of the connection electrode. Thereby, the decrease of an output due to the exposure of the conductive resin adhesive can be prevented and the curing of the conductive resin adhesive can be easily checked.

In the above-described one aspect, the decrease of an output can be suppressed by preventing the exposure of the conductive resin adhesive between the connection electrode and the wiring material, and the curing of the resin can be easily checked. Thus, performance and reliability of the solar cell module can be increased.

BRIEF DESCRIPTION OF THE DRAWINGS

FIG. 14 is a view of a region corresponding to the wiring material projected on the projection plane parallel with the light-receiving surface in the solar cell module according to the second embodiment;

DETAILED DESCRIPTION OF EMBODIMENTS

Figure 1:
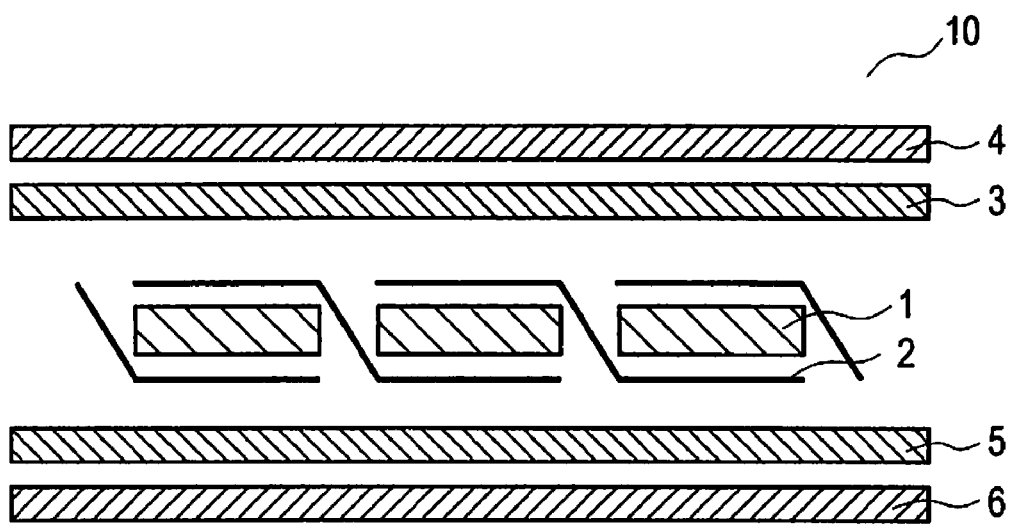
FIG. 1 is a schematic view showing the configuration of a solar cell module of an embodiment.

An embodiment of the invention will be described below based on the drawing. The drawing is only an example, and the invention is not limited to proportions of sizes and the like in the drawing. Accordingly, specific sizes and the like have to be judged by considering the following description.

Prepositions, such as "on", "over" and "above" may be defined with respect to a surface, for example a layer surface, regardless of that surface's orientation in space. The preposition "above" may be used in the specification and claims even if a layer is in contact with another layer. The preposition "on" may be used in the specification and claims when a layer is not in contact with another layer, for example, when there is an intervening layer between them.

(Configuration of Solar Cell Module)

Solar cell module 10 according to an embodiment of the present invention will be described by referring to a schematic view shown in FIG. 1.

In FIG. 1, multiple solar cells 1 are electrically connected to one another by wiring material 2. Wiring material 2 is formed of a metal material, such as a copper foil, and a surface thereof may be covered with a conductive material, such as tinning. Translucent front surface protection member 4 is bonded to the light-receiving surface of solar cell 1 by translucent adhesive 3. Front surface protection member 4 is formed of a translucent protection member, for example, glass and translucent plastics. In addition, back surface protection member 6 is bonded to the back surface of solar cell 1 by adhesive 5. Back surface protection member is formed of, for example, a laminated film having a structure in which a resin film, such as PET, or an Al foil is sandwiched by resin films. Moreover, adhesives 3 and 5 are translucent resins, such as EVA and PVB, and each have a function to shield solar cell 1. Further, a terminal box (not shown) for extracting electricity is arranged on the back surface of the back surface protection member 6. Furthermore, a frame body is attached to the outer periphery of the solar cell module, if needed.

Figure 2A:
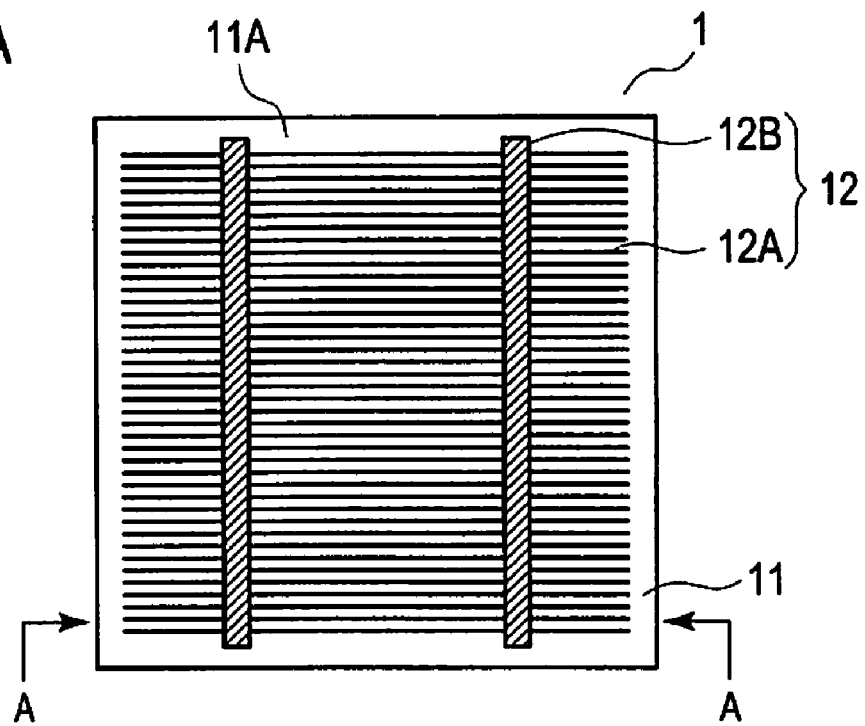
FIGS. 2A and 2B are plan views of a solar cell of the embodiment.
Figure 2B:
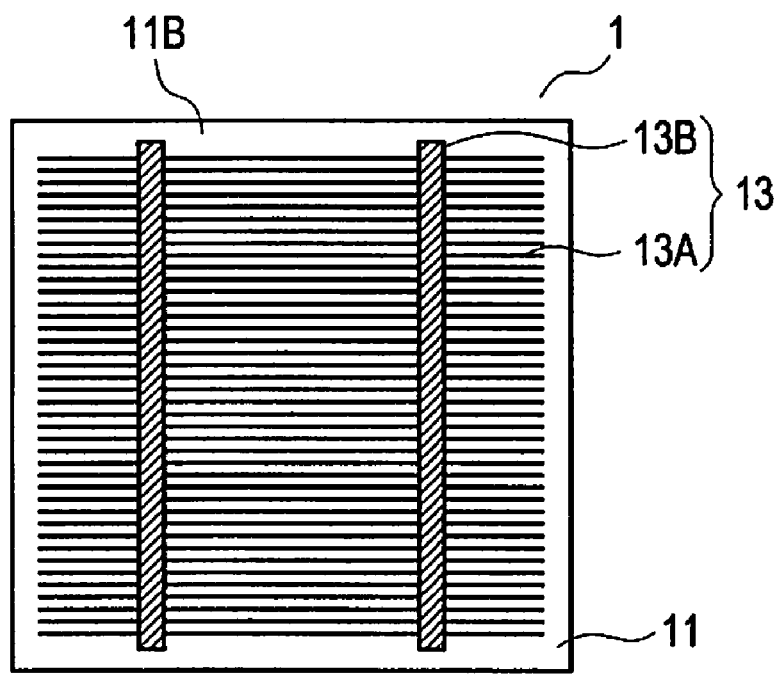
Figure 3:
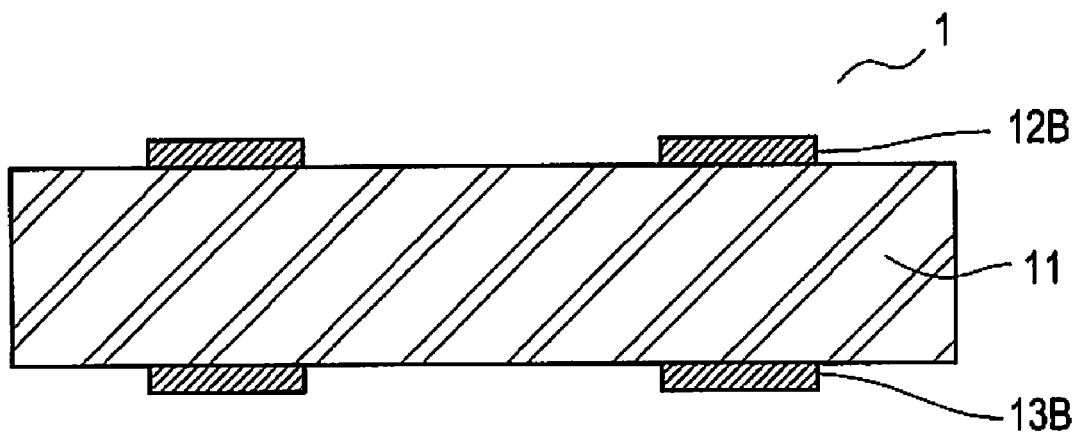
FIG. 3 is a cross-sectional view of the solar cell of the embodiment.

As shown in the plan views of FIG. 2 and the cross-sectional view of FIG. 3, solar cell 1 has photoelectric converter 11, and power collecting electrodes 12 and 13, which are respectively provided on light-receiving surface 11A and back surface 11B of photoelectric converter 11. FIG. 3 is a cross-sectional view taken along the A-A line of the plan view shown in FIG. 2. Photoelectric converter 11 is formed of a p-n junction or p-i-n junction semiconductor. In addition, single crystal silicon, polycrystal silicon, other crystal semiconductor materials, compound semiconductor materials such as GaAs or CuInSe, or other solar cell semiconductor materials can be used as semiconductor material that forms photoelectric converter 11. These materials may also be combined.

As shown in the plan view of FIG. 2A, power collecting electrodes 12 formed on the light-receiving surface of photoelectric converter 11 have multiple finger electrodes 12A and bus bar electrodes. Finger electrode 12A is configured to collect electron-hole carriers generated by photoelectric converter 11 using incident light. The bus bar electrode is configured to collect the carriers collected by finger electrodes 12A. The bus bar electrode also functions as connection electrode 12B to which wiring material 2 is connected. FIG. 2B is a plan view on the back surface of the solar cell. Power collecting electrodes 13 formed on the back surface have multiple finger electrodes 13A and bus bar electrodes. Finger electrode 13A is configured to collect photogenerated carriers, while the bus bar electrode is configured to collect the carriers collected by finger electrodes 13A. The bus bar electrode also functions as connection electrode 13B to which wiring material 2 is connected. Note that the power collecting electrodes 13 on the back surface are not limited to the above-described configuration and can have various kinds of configurations. For example, a conductive agent may be applied on the entire back surface so as to be used as a power collecting electrode.

Power collecting electrodes 12 and 13 are formed of, for example, a thermosetting conductive paste, using an epoxy resin as a binder and conductive particles as a filler. A single crystal silicon solar cell, polycrystal silicon solar cell, or the like, is not limited to this conductive paste, and a sintering type paste may also be used. The baking-type paste is formed of a metal powder such as silver and aluminum, a glass flit, an organic vehicle, and the like. In addition, it may also be formed of a general metal material such as silver or aluminum.

Figure 4:
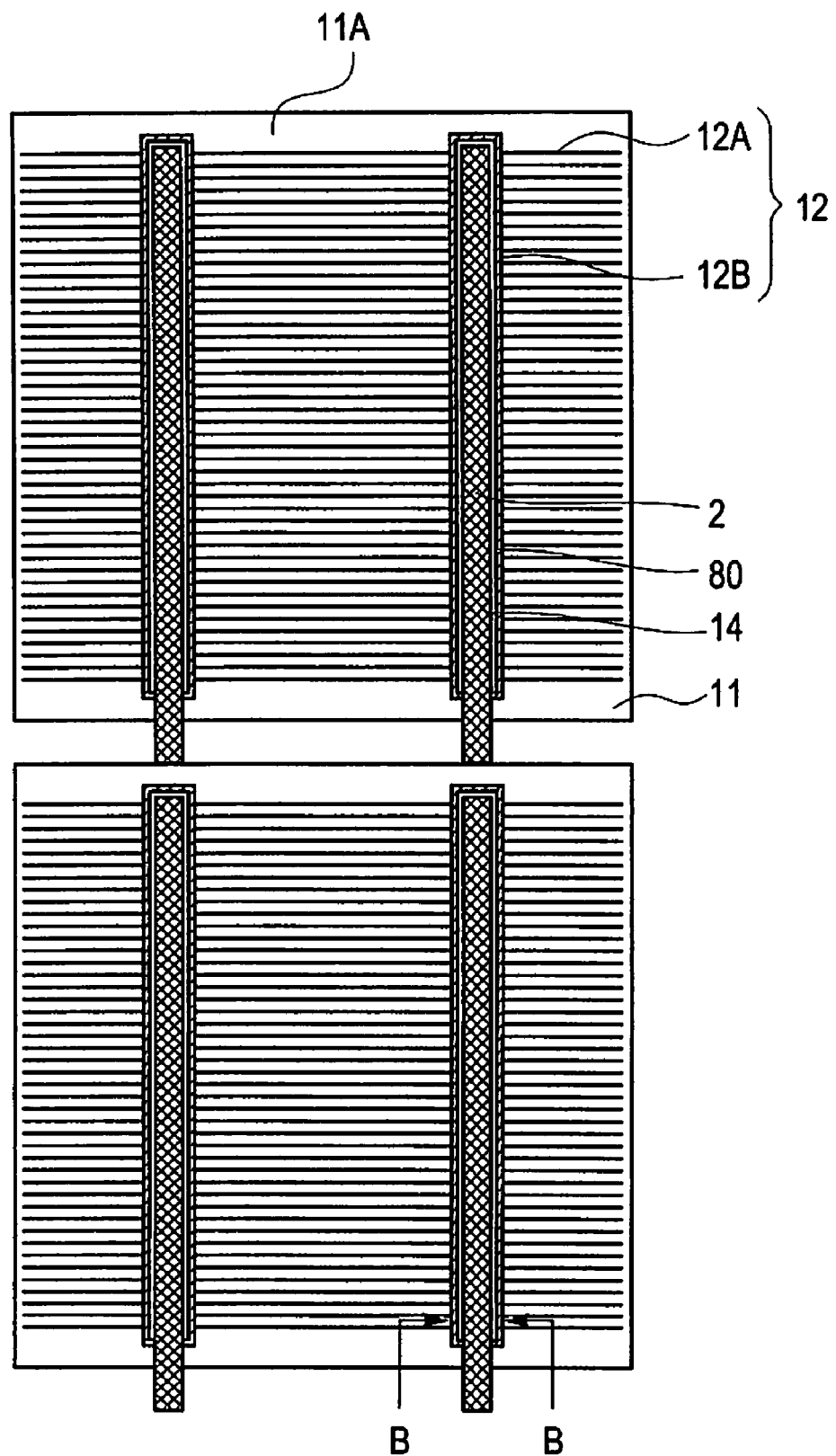
FIG. 4 is a top view on a light-receiving surface side of a connection between solar cells.
Figure 5:
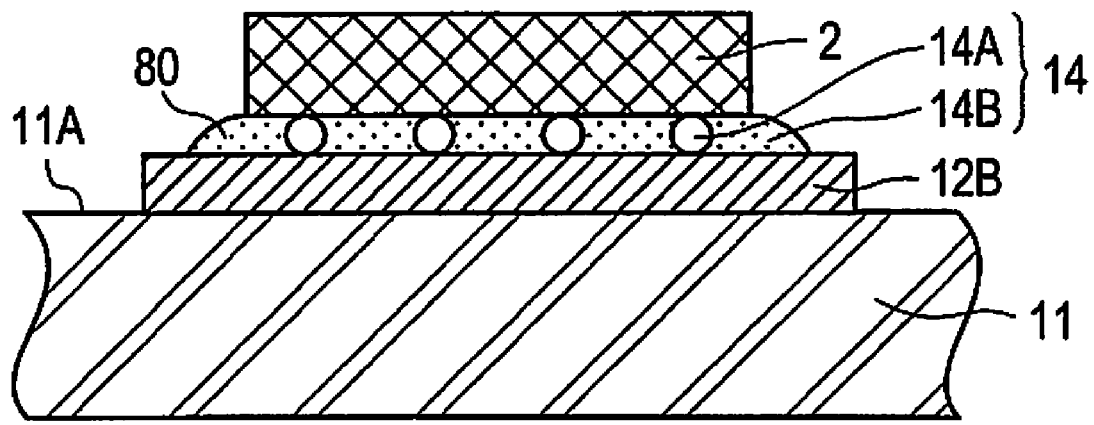
FIG. 5 is an enlarged cross-sectional view of essential parts for illustrating a connection relationship among a connection electrode, a conductive resin adhesive, and a wiring material, which are arranged on the solar cell.

FIG. 4 is a top view of a connection between solar cells 1 by using wiring materials 2 on the light-receiving surface side. FIG. 5 is an enlarged cross-sectional view of essential parts taken along the B-B line of the plan view shown in FIG. 4, for illustrating a connection between wiring material 2 and connection electrode 12B. As shown in the enlarged cross-sectional view of essential parts in FIG. 5, wiring material 2 is connected to connection electrode 12B by conductive resin adhesive 14. Conducting resin adhesive 14 includes resin 14B containing multiple conductive particles 14A. Connection electrode 12B and wiring material 2 are electrically connected to each other through conductive particles 14A. In addition, connection electrode 12B is bonded to wiring material 2 by resin 14B.

The material of resin 14B includes, for example, an epoxy resin, acrylic resin, polyimide resin, phenol resin, urethane resin, silicon resin, and the like. At least one kind of resin selected from the foregoing resins, or a mixture or copolymer of these resins may be used as the material of resin 14B.

At least one kind of metal particles, selected from the group consisting of nickel, copper, silver, aluminum, tin, gold, and the like or an alloy or mixture thereof, or the like can be used as conductive particles 14A, for example. Alternatively, at least one kind of inorganic oxides, selected from the group consisting of alumina, silica, titanium oxide, glass, and the like to which a metal coating is applied, or at least one kind of resins, selected from the group consisting of an epoxy resin, acrylic resin, polyimide resin, phenol resin, urethane resin, silicon resin, and the like, or a mixture or copolymer of these resins to which a metal coating is applied can be used as conductive particles 14A.

A concentration of conductive particles 14A contained in resin 14B is set to be a concentration such that for example, wiring material 2 and connection electrode 12B would be electrically connected to each other by one to several conductive particles 14A stacked on one another in a thickness direction. By setting the concentration as such, the number of contact interfaces between conductive particles 14A present in the thickness direction can be reduced. Accordingly, contact resistance generated in the contact interfaces between conductive particles 14A can be reduced. Thus, a resistance loss between wiring material 2 and connection electrode 12B can be reduced.

Conductive resin adhesive 14 is given a color change characteristic whereby color is changed by curing, by containing a temperature indicating material therein, for example. Alternatively, conductive resin adhesive 14 is provided with the above function by containing a thermosetting epoxy based resin which changes its color by curing.

The connection structure between a wiring material and a connection electrode according to the present embodiment will be described in detail below.

First Embodiment

A solar cell module according to a first embodiment will be described below.

As shown in FIGS. 4 and 5, in the solar cell module according to the present embodiment, conductive resin adhesive 14 is formed within the surface on wiring material 2 side of connection electrode 12B. In addition, wiring material 2 is arranged so that the top surface of a peripheral portion of conductive resin adhesive 14 would protrude from wiring material 2 to form exposed portion 80.

Figure 6:
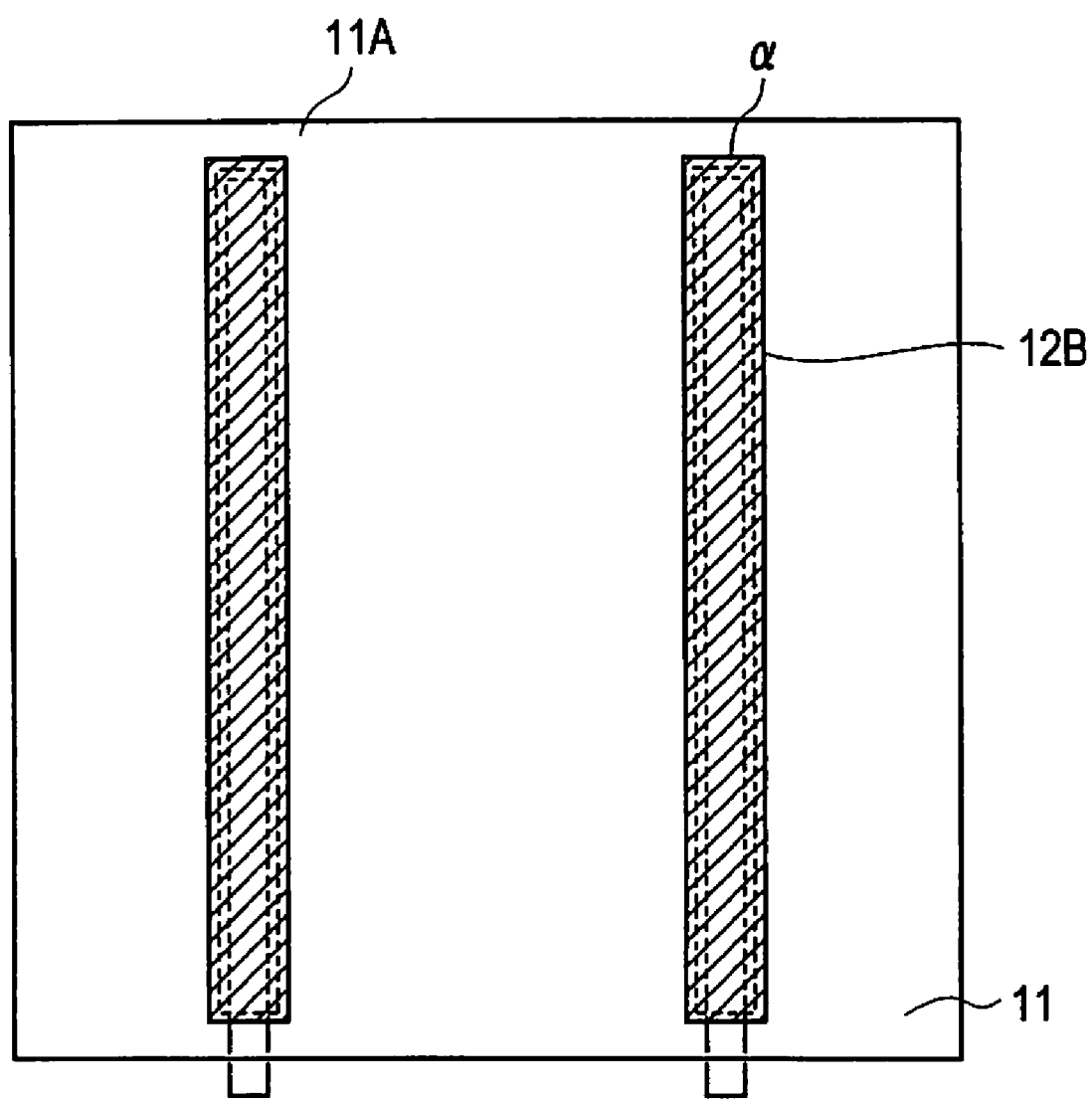
FIG. 6 is a view of a region corresponding to a connection electrode projected on a projection plane parallel with a light-receiving surface in a solar cell module according to a first embodiment.
Figure 7:
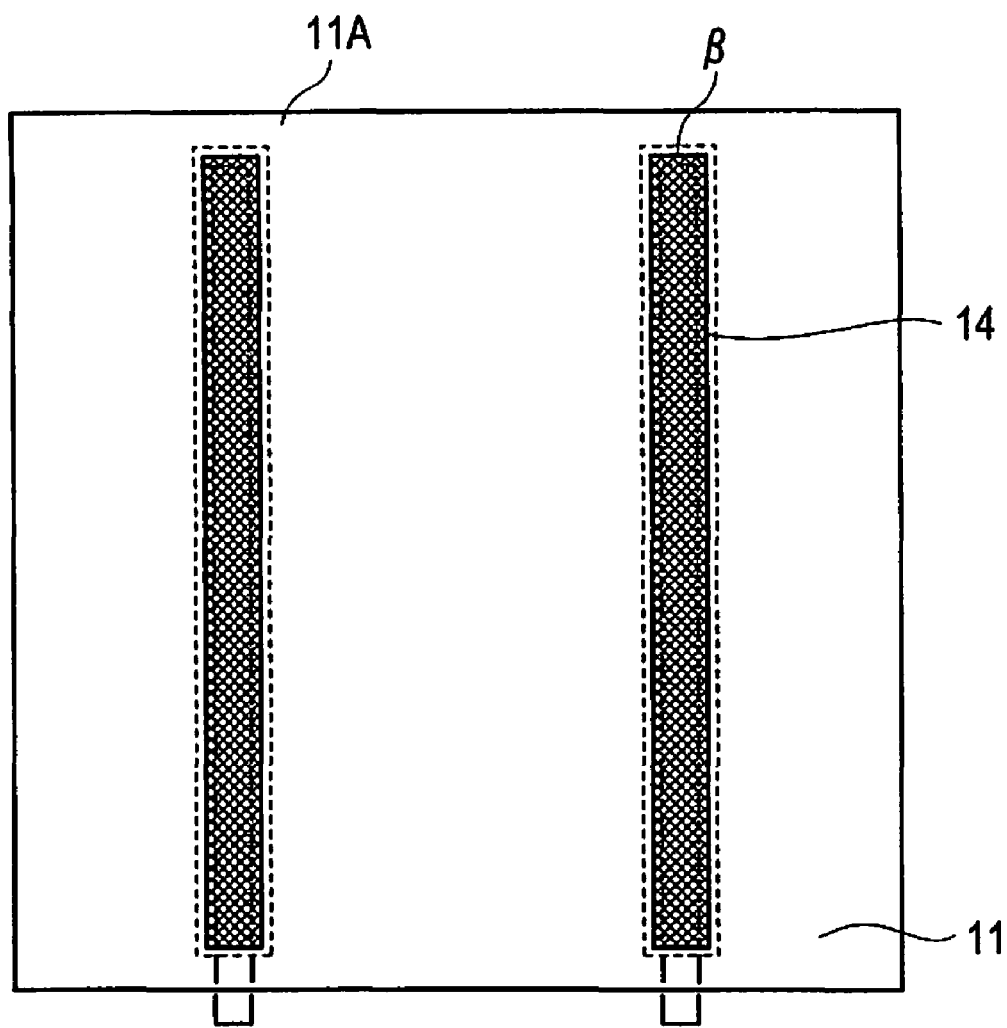
FIG. 7 is a view of a region corresponding to a conductive resin adhesive projected on the projection plane parallel with the light-receiving surface in the solar cell module according to the first embodiment.
Figure 8:
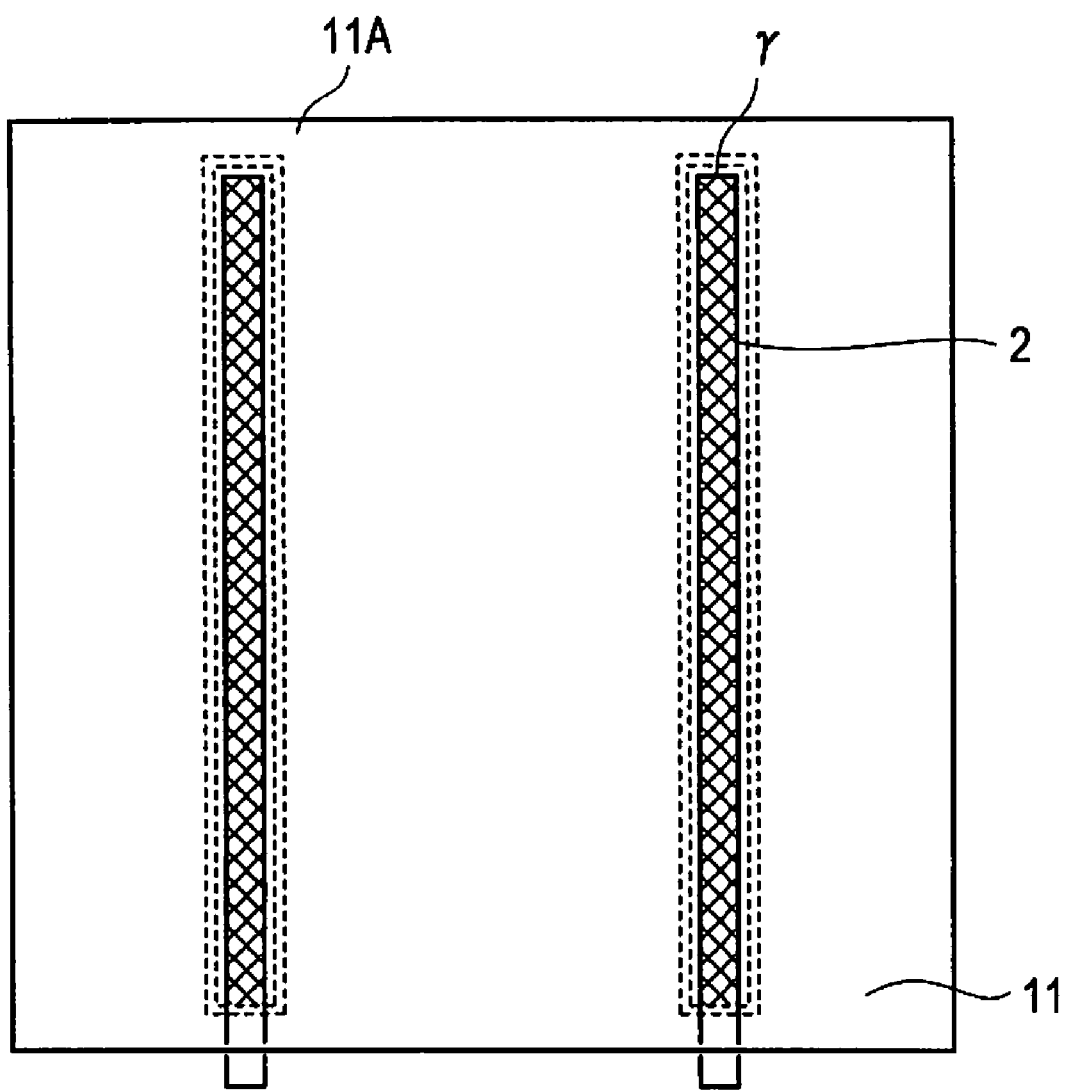
FIG. 8 is a view of a region corresponding to the wiring material projected on the projection plane parallel with the light-receiving surface in the solar cell module according to the first embodiment.

FIGS. 6 to 8 are views, each of which project onto a projection plane parallel with light-receiving surface 11A, for illustrating regions respectively corresponding to connection electrode 12B, conductive resin adhesive 14, and wiring material 2. Region α surrounded by the solid line in FIG. 6, is a region corresponding to connection electrode 12B. Region β surrounded by the solid line in FIG. 7, is a region corresponding to conductive resin adhesive 14. Region γ surrounded by the solid line in FIG. 8, is a region corresponding to wiring material 2. As shown in these figures, region β corresponding to conductive resin adhesive 14, is arranged within region α corresponding to connection electrode 12B on the projection plane parallel with the light-receiving surface. As described above, conductive resin adhesive 14 is formed within region α corresponding to connection electrode 12B on the projection plane parallel with the light-receiving surface 11A. Thereby, there would be no chance for conductive resin adhesive 14 to cover light-receiving surface 11A of photoelectric converter 11 while exposing connection electrode 12B. Thus, conductive resin adhesive 14 would not lessen the light-receiving area even after a color change from curing. In addition, even in a case where the peripheries of region α corresponding to connection electrode 12B and region β corresponding to conductive resin adhesive 14 partially or entirely overlap with each other, conductive resin adhesive 14 would not lessen the light-receiving area.

Figure 9A:
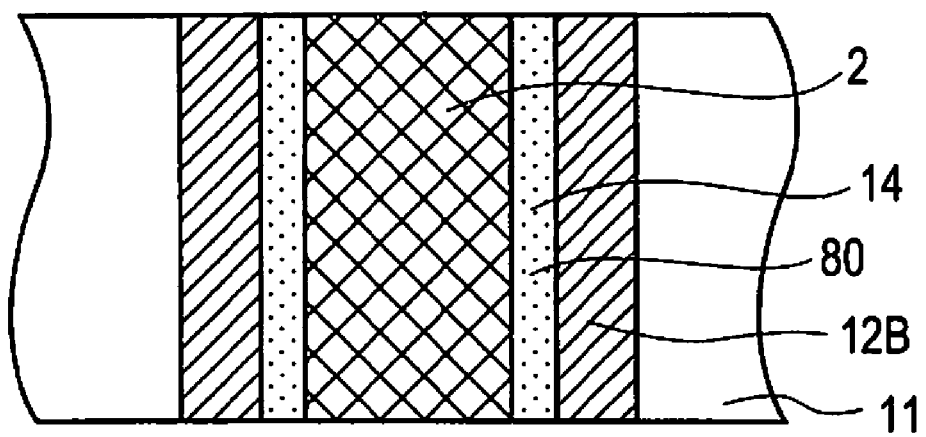
FIGS. 9A and 9B are each an enlarged plan view of essential parts for illustrating a relationship among the connection electrode, the conductive resin adhesive, the wiring material, and an exposed portion of the solar cell module according to the first embodiment.
Figure 9B:
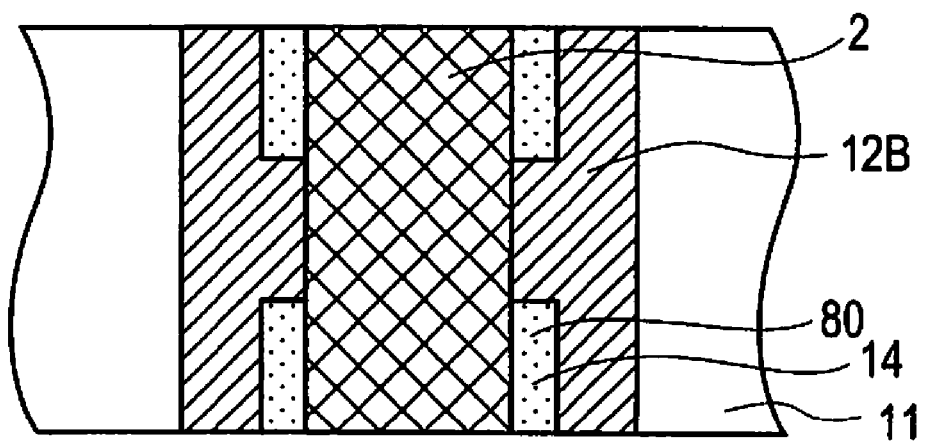

As described above, conductive resin adhesive 14 is arranged so as to protrude from wiring material 2 within the surface on the wiring material side of connection electrode 12B. Thus, according to the present embodiment, as shown in the enlarged cross-sectional view of essential parts in FIG. 5 and the enlarged plan view of essential parts in FIG. 9A, exposed portion 80 of conductive resin adhesive 14 protruding from wiring material 2 can be visually recognized from the light-receiving surface side. Here, FIGS. 9A and 9B are each an enlarged plan view of essential parts for illustrating an arrangement relationship among connection electrode 12B, conductive resin adhesive 14, and wiring material 2. Accordingly, by checking that conductive resin adhesive 14 is colored in exposed portion 80, the curing of conductive resin adhesive 14 can be checked. In addition, a space between connection electrode 12B and wiring material 2 is filled up with conductive resin adhesive 14 without any gap, and the adhesive thus filled is then cured. Thus, by checking that conductive resin adhesive 14 is cured in exposed portion 80, the degree of bonding between connection electrode 12B and wiring material 2 can be checked.

Note that in the present embodiment, as shown in the enlarged plan view of essential parts in FIG. 9B, exposed portion 80 may be formed in part of the periphery of conductive resin adhesive 14. In this case, when seen from the light-receiving surface side, part of conductive resin adhesive 14 also protrudes from wiring material 2 to form exposed portion 80. Alternatively, conductive resin adhesive 14 may protrude from wiring material 2 in a longitudinal direction of wiring material 2 to form exposed portion 80. In this case, similar effects can also be obtained.

As conductive resin adhesive 14 provided on connection electrode 12B, a paste-like or tape-like conductive resin adhesive can be used. Here, conductive resin adhesive 14 is applied so as to have a smaller width than that of connection electrode 12B when it spreads by the processes of pressurization and bonding, and to have a wider width than that of wiring material 2. Then, after wiring material 2 is stacked on conductive resin adhesive 14, conductive resin adhesive 14 is caused to be cured and thereby connection electrode 12B and wiring material 2 are bonded to each other through the processes of pressurization and bonding. With these processes, the wiring of the solar cell module according to the present embodiment can be made.

Second Embodiment

Next, a solar cell module according to a second embodiment will be described below.

Figure 10A:
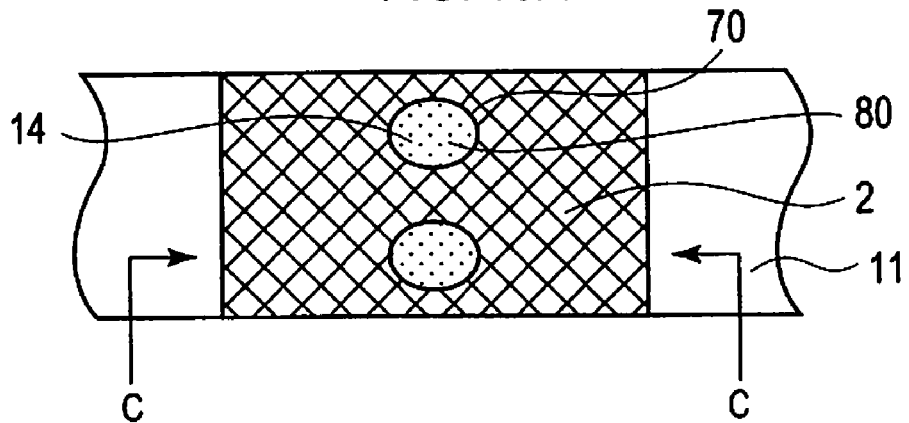
FIGS. 10A to 10C are each an enlarged plan view of essential parts for illustrating a relationship among a connection electrode, a conductive resin adhesive, a wiring material, and an exposed portion of a solar cell module according to a second embodiment.
Figure 10B:
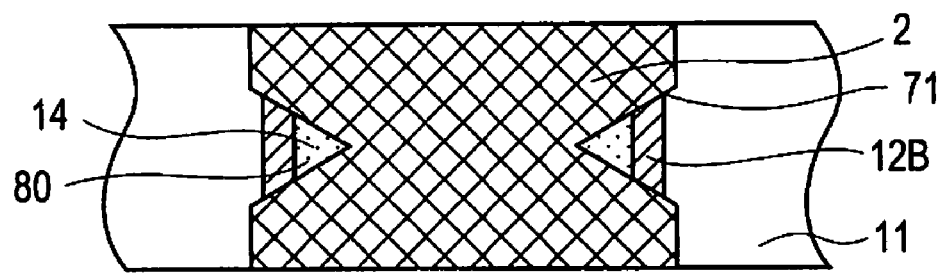
Figure 10C:
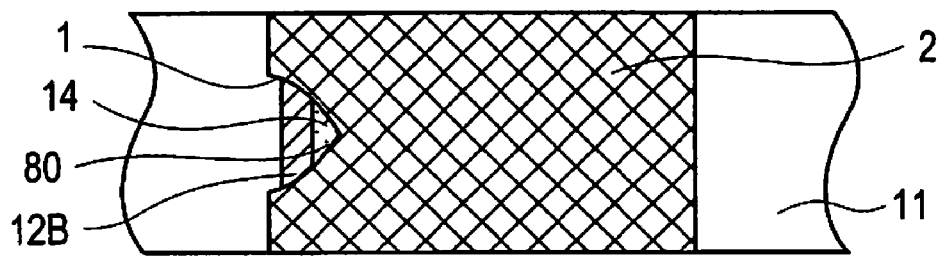
Figure 11:
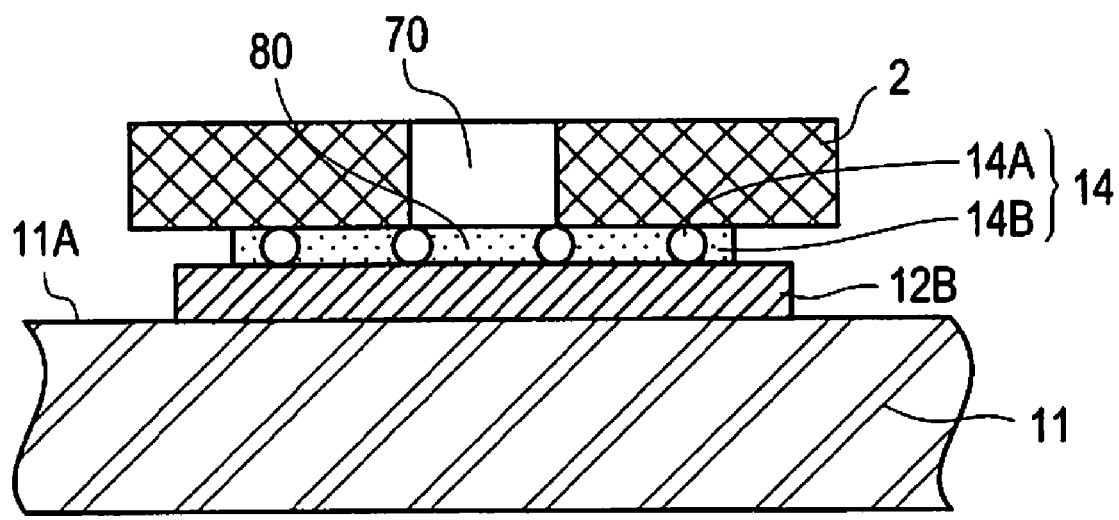
FIG. 11 is an enlarged cross-sectional view of essential parts of a connection relationship among the connection electrode, the conductive resin adhesive, and the wiring material of the solar cell module according to the second embodiment.

FIGS. 10A to 10C are each an enlarged plan view of essential parts for illustrating a bonding structure of wiring material 2 by conductive resin adhesive 14. FIG. 11 is a cross-sectional view taken along the C-C line of the enlarged plan view of essential parts shown in FIG. 10A. As shown in FIGS. 10A to 10C and 11, in the solar cell module according to the present embodiment, conductive resin adhesive 14 is formed within the surface on wiring material 2 side of connection electrode 12B. In addition, opening 70 is provided in wiring material 2 for exposing conductive resin adhesive 14 provided thereunder.

Figure 12:
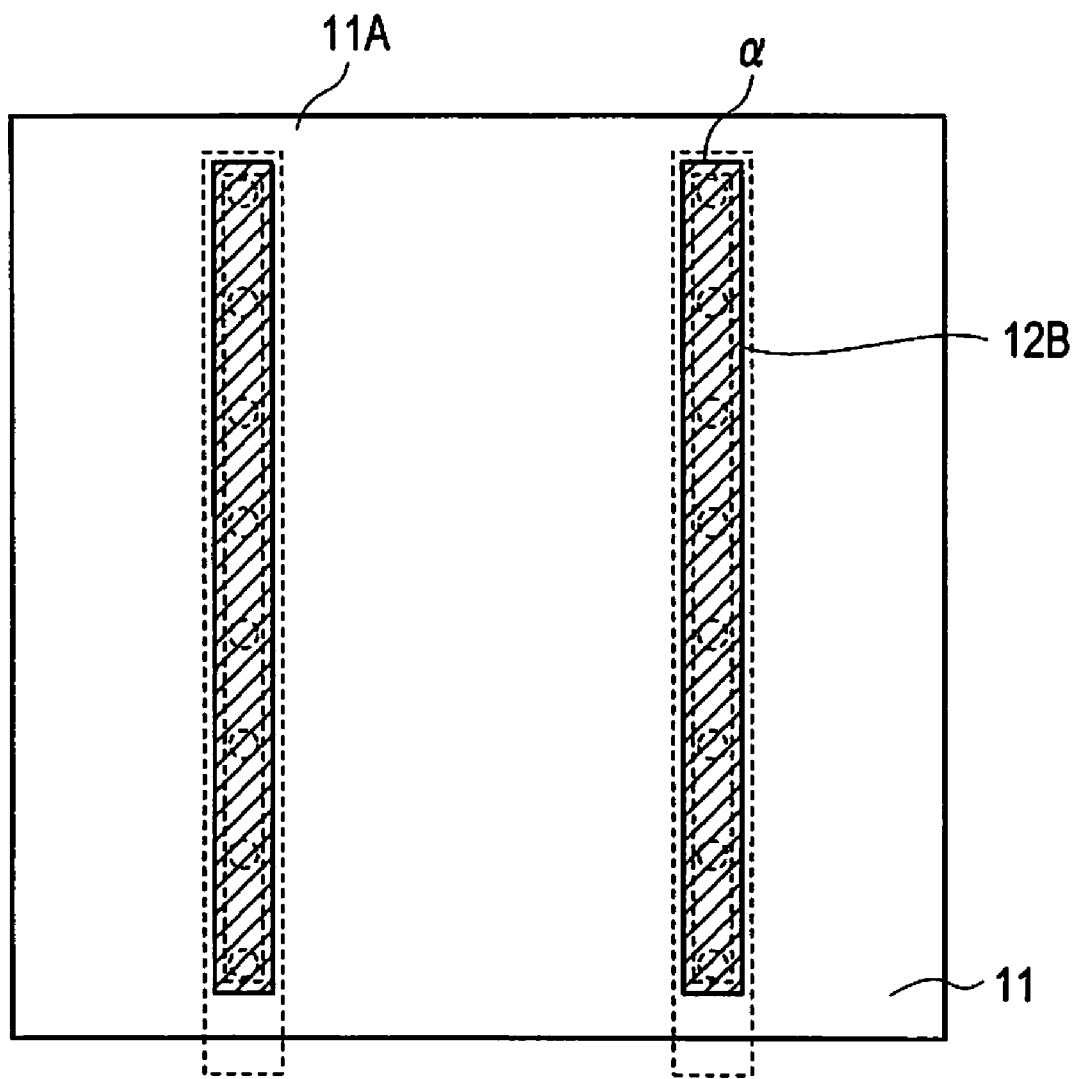
FIG. 12 is a view of a region corresponding to the connection electrode projected on a projection plane parallel with a light-receiving surface in the solar cell module according to the second embodiment.
Figure 13:
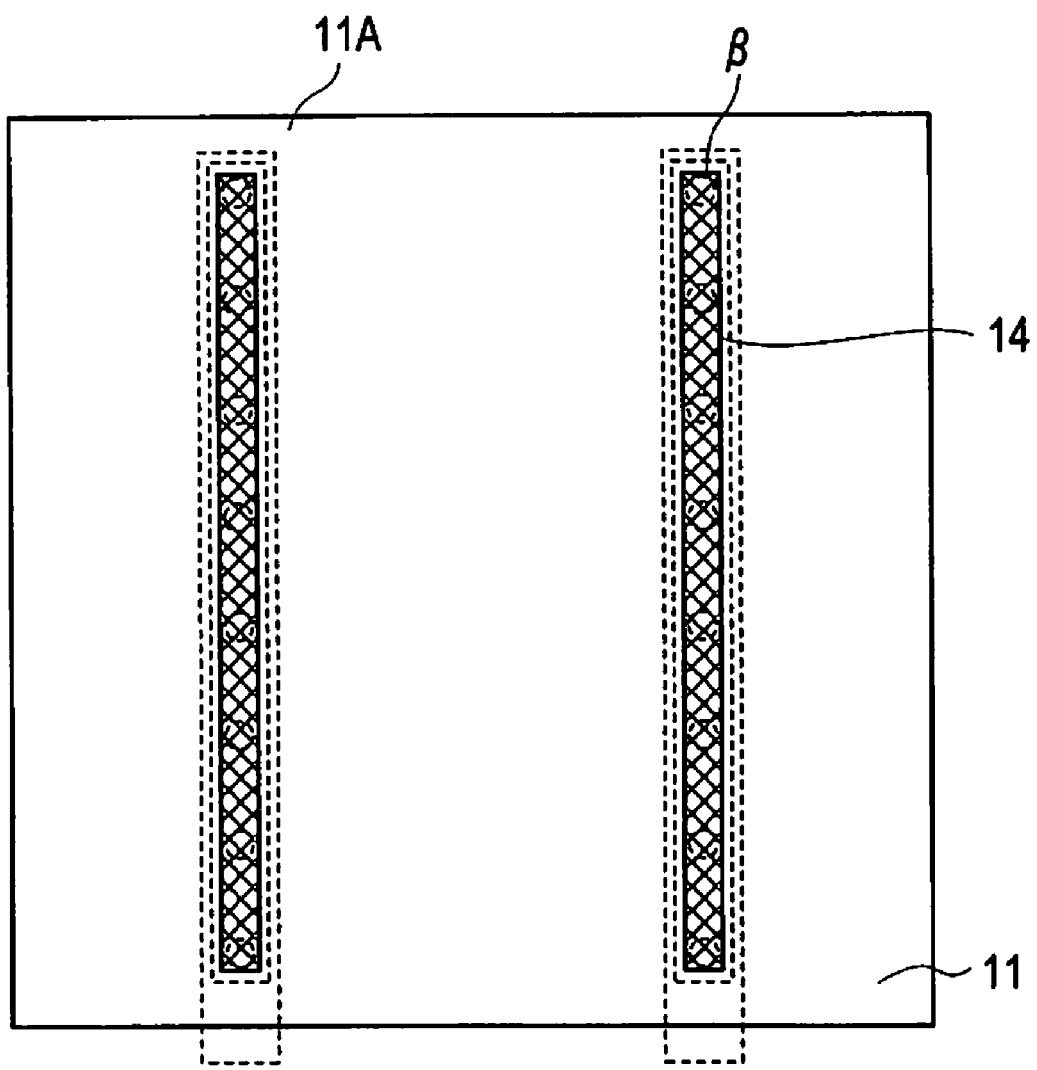
FIG. 13 is a view of a region corresponding to the conductive resin adhesive projected on the projection plane parallel with the light-receiving surface in the solar cell module according to the second embodiment.

FIGS. 12 to 14 are views projected onto a projection plane that is parallel with light-receiving surface 11A, for illustrating regions respectively corresponding to connection electrode 12B, conductive resin adhesive 14, and wiring material 2. Region α surrounded by the solid line in FIG. 12 is a region corresponding to connection electrode 12B. Region β surrounded by the solid line in FIG. 13 is a region corresponding to conductive resin adhesive 14. Region γ surrounded by the solid line in FIG. 14 is a region corresponding to wiring material 2. As shown in these figures, region β corresponding to conductive resin adhesive 14 is arranged within region α corresponding to connection electrode 12B and region γ corresponding to wiring material 2 on the projection plane parallel with the light-receiving surface. As described above, conductive resin adhesive 14 is formed within region α to connection electrode 12B on the projection plane parallel with the light-receiving surface 11A. Thereby, there would be no chance for conductive resin adhesive 14 to cover light-receiving surface 11A of photoelectric converter 11 while exposed from connection electrode 12B. Thus, conductive resin adhesive 14 would not decrease the light-receiving area even after coloration by curing. In addition, even in a case where the peripheries of region α corresponding to connection electrode 12B and region β corresponding to conductive resin adhesive 14 partially or entirely overlap with each other, conductive resin adhesive 14 would not decrease the light-receiving area.

In addition, conductive resin adhesive 14 is arranged so as to be exposed on the light-receiving surface side through opening 70 provided in wiring material 2. Exposed portion 80 of conductive resin adhesive 14 exposed through this opening 70 can be visually recognized from the light-receiving surface side. Accordingly, by checking a color of exposed portion 80 through opening 70, curing of conductive resin adhesive 14 can be checked. In addition, a space between connection electrode 12B and wiring material 2 is filled with conductive resin adhesive 14 without any gap, and the adhesive thus filled is then cured. Accordingly, by checking that conductive resin adhesive 14 is cured through opening 70, the degree of bonding between connection electrode 12B and wiring material 2 can be checked.

Note that in the present embodiment, the configuration of opening 70 provided in wiring material 2 is not limited to a circular opening as shown in FIG. 10A. For example, it may be elliptical, rectangular, polygonal, or other shape, other than a circular shape. Alternatively, as shown in FIG. 10B, not only the opening but also notch 71 can be provided in part of wiring material 2. Even with such a configuration, the portion protruding from notch 71 of conductive resin adhesive 14 serves as exposed portion 80. Thus, similar effects to those obtained when opening 70 is provided can be attained. Further, as shown in FIG. 10C, notch 71 can be provided on one side of wiring material 2.

Third Embodiment

Next, a solar cell module according to a third embodiment will be described below.

Figure 15A:
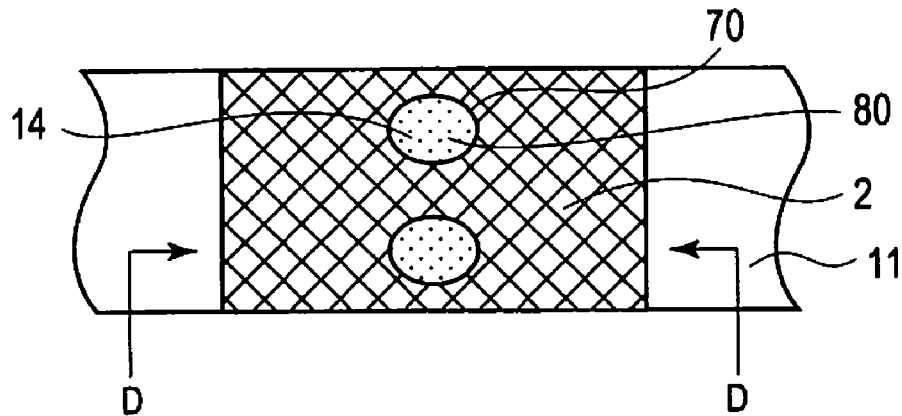
FIGS. 15A to 15C are each an enlarged plan view of essential parts for illustrating a relationship among a connection electrode, a conductive resin adhesive, a wiring material, and an exposed portion of a solar cell module according to a third embodiment.
Figure 15B:
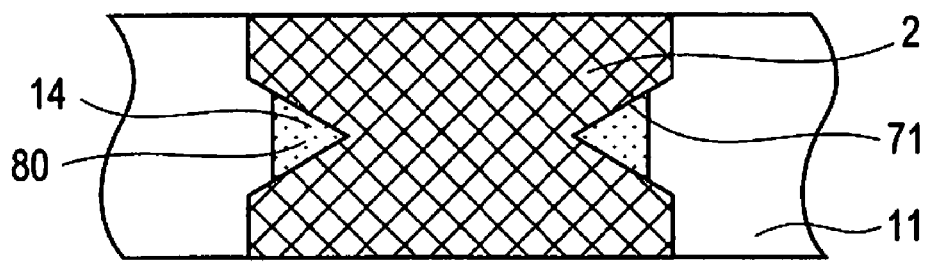
Figure 15C:
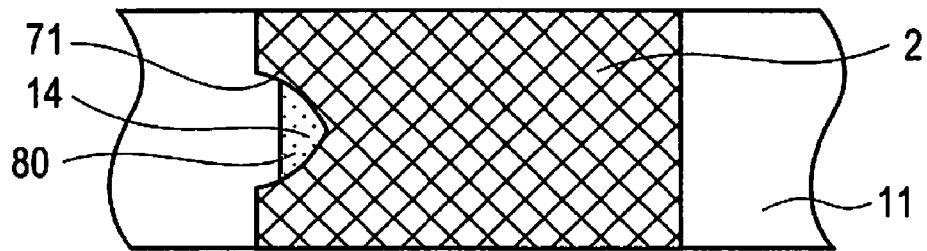
Figure 16:
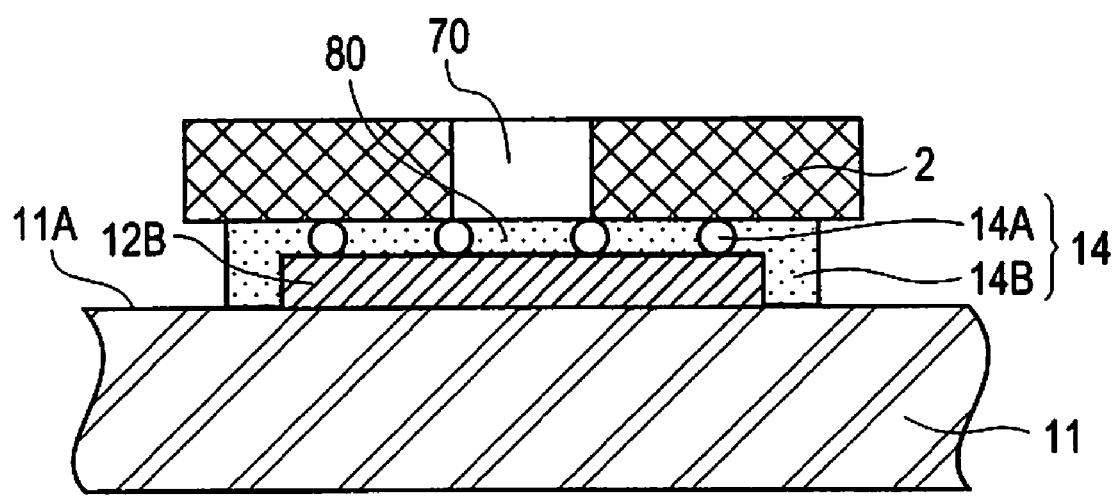
FIG. 16 is an enlarged plan view of essential parts of a connection relationship among the connection electrode, the conductive resin adhesive, and the wiring material of the solar cell module according to the third embodiment.

FIGS. 15A to 15C are each an enlarged plan view of essential parts for illustrating a bonding structure of wiring material 2 by conductive resin adhesive 14. FIG. 16 is a cross-sectional view taken along the D-D line of the enlarged plan view of essential parts shown in FIG. 15A. In the solar cell module according to the present embodiment, as shown in FIGS. 15A to 15C and 16, conductive resin adhesive 14 is formed within the surface on connection electrode 12B side of wiring material 2 and covers an upper surface and side surfaces on wiring material 2 side of connection electrode 12B. In addition, opening 70 is provided in wiring material 2 for exposing conductive resin adhesive 14 provided thereunder.

Figure 17:
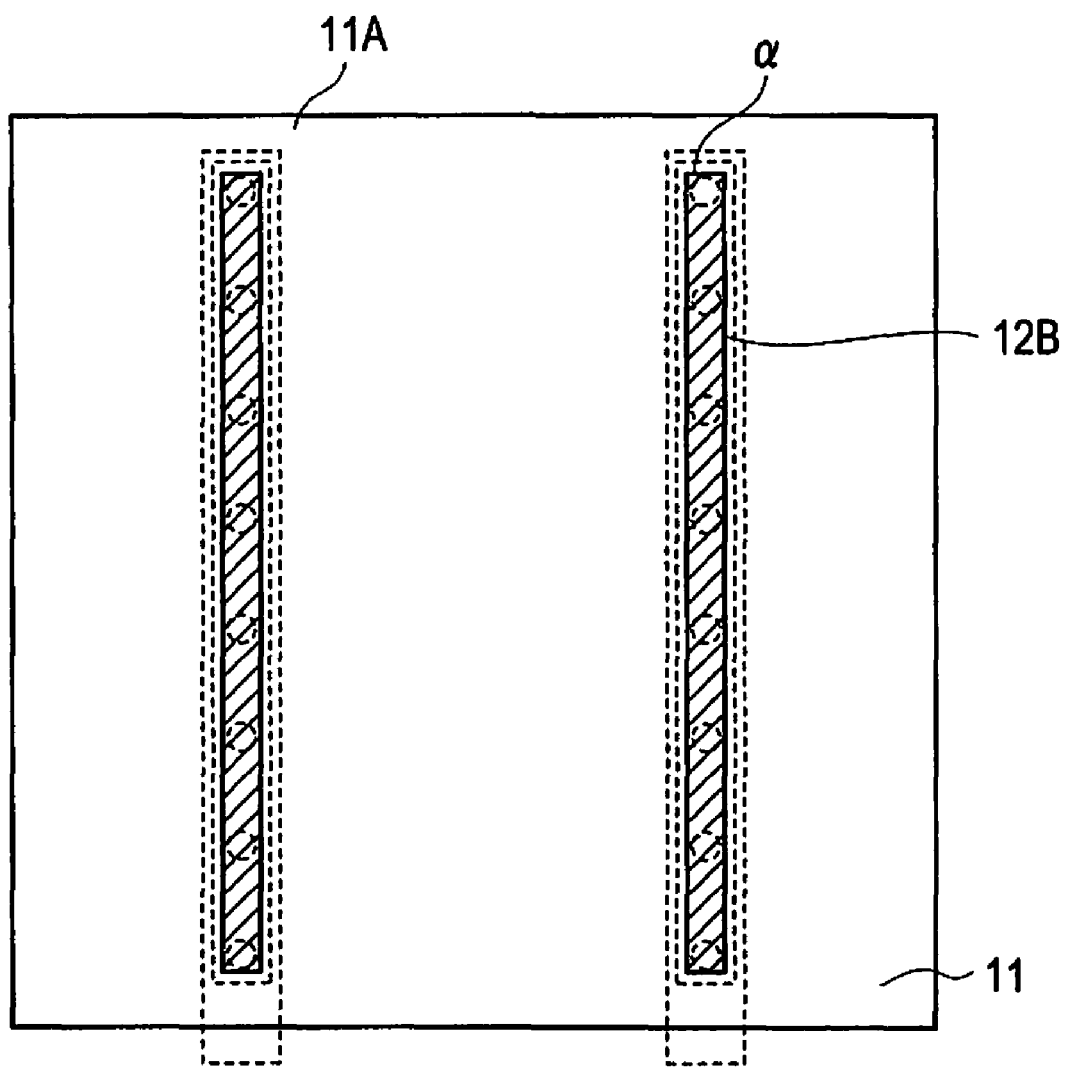
FIG. 17 is a view of a region corresponding to the connection electrode projected on a projection plane parallel with the light-receiving surface in the solar cell module according to the third embodiment.
Figure 18:
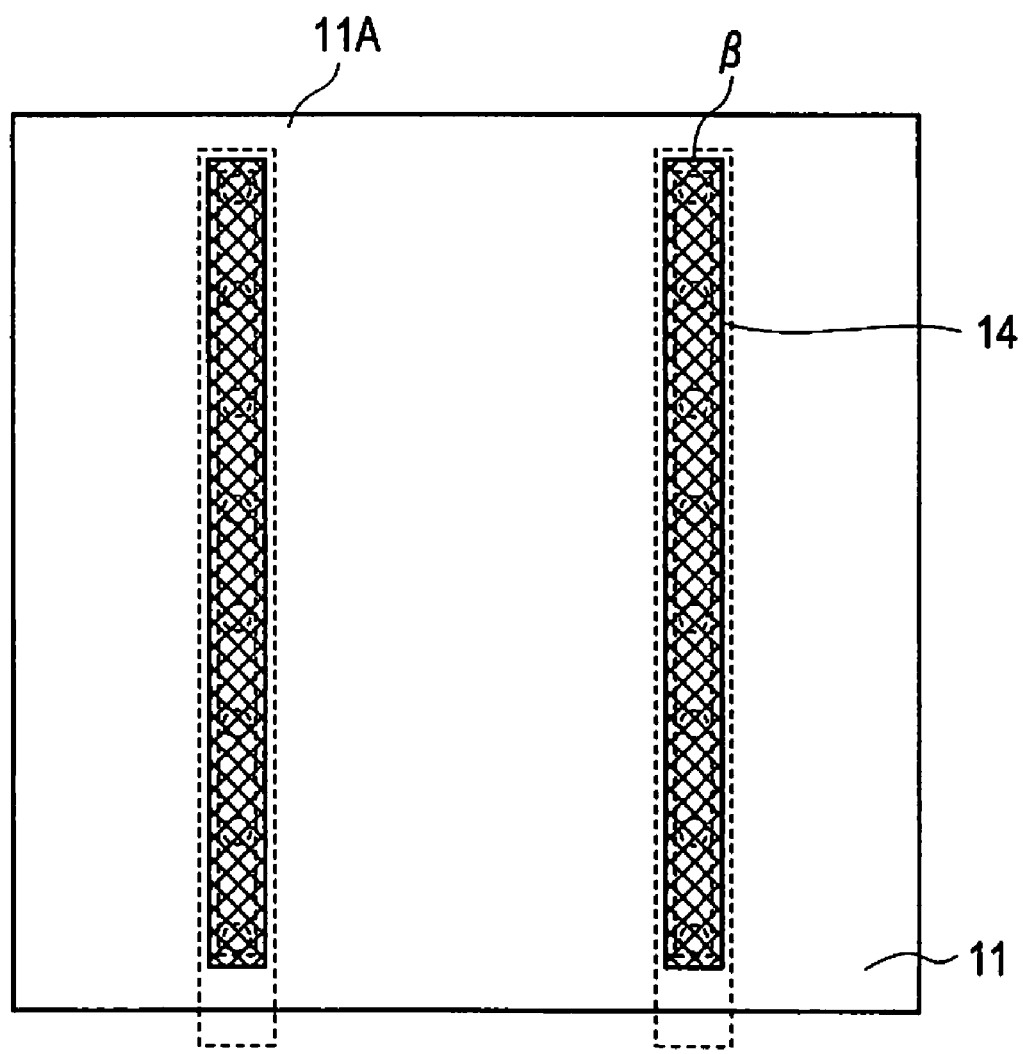
FIG. 18 is a view of a region corresponding to the conductive resin adhesive projected on the projection plane parallel with the light-receiving surface in the solar cell module according to the third embodiment.
Figure 19:
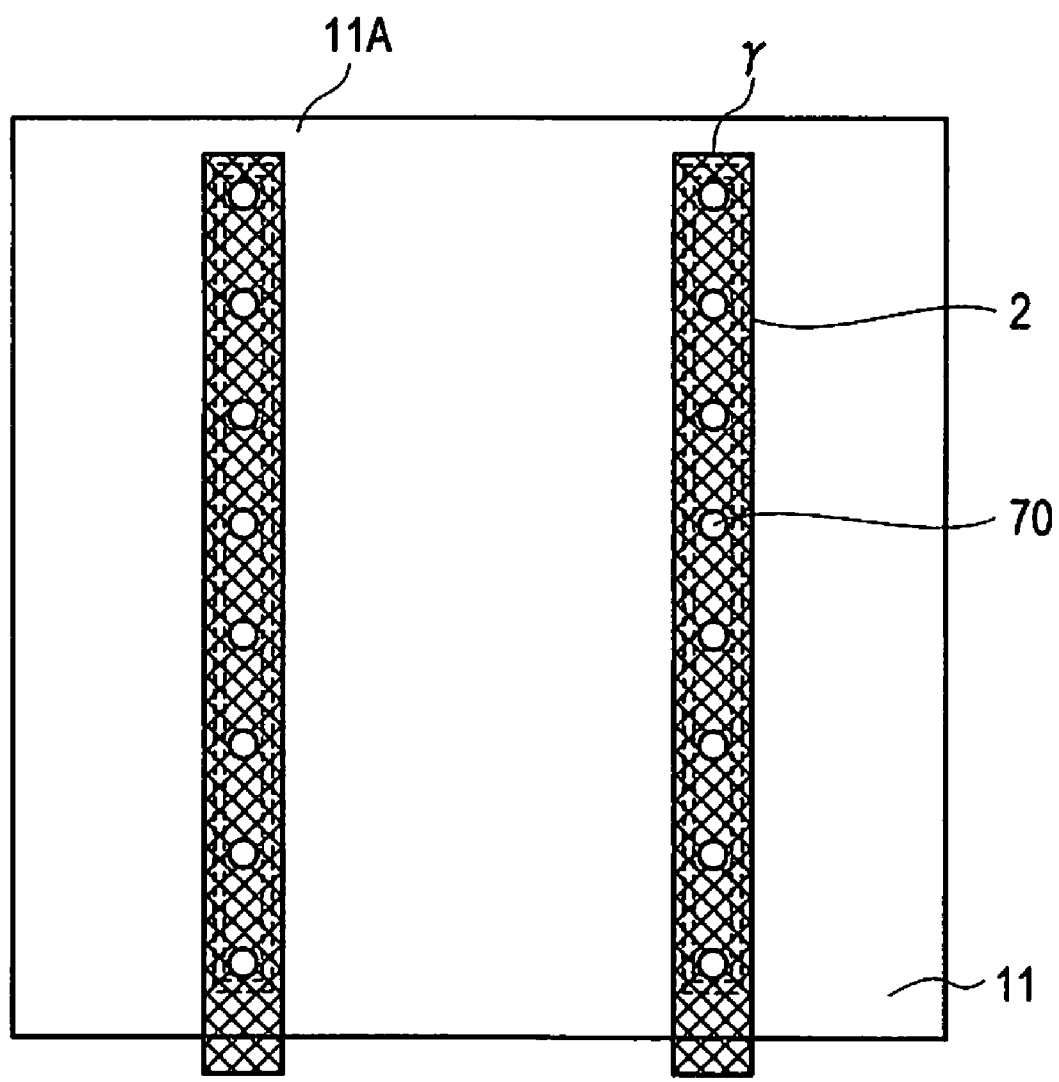
FIG. 19 is a view of a region corresponding to the wiring material projected on the projection plane parallel with the light-receiving surface in the solar cell module according to the third embodiment.

FIGS. 17 to 19 are views projected onto a projection plane parallel with light-receiving surface 11A, for illustrating regions respectively corresponding to connection electrode 12B, conductive resin adhesive 14, and wiring material 2. Region α surrounded by the solid line in FIG. 17 corresponds to connection electrode 12B. Region β surrounded by the solid line in FIG. 18 corresponds to conductive resin adhesive 14. Region γ surrounded by the solid line in FIG. 19 is corresponds to wiring material 2. As shown in these figures, region β corresponding to conductive resin adhesive 14 is arranged within one of region γ corresponding to wiring material 2 and region α corresponding to connection electrode 12B on the projection plane parallel with the light-receiving surface. As described above, conductive resin adhesive 14 is formed within one of region γ corresponding to wiring material 2 and region α corresponding to connection electrode 12B on the projection plane parallel with the light-receiving surface 11A. Thereby, there would be no chance for conductive resin adhesive 14 to cover light-receiving surface 11A of photoelectric converter 11 while exposed from wiring material 2. Thus, conductive resin adhesive 14 would not lessen the light-receiving area even after coloration by curing. In addition, even when the respective peripheries of region β corresponding to conductive resin adhesive 14 and region γ corresponding to wiring material 2 partially or entirely overlap with each other, conductive resin adhesive 14 would not decrease the light-receiving area.

In addition, conductive resin adhesive 14 is arranged so as to be exposed on the light-receiving surface side through opening 70 provided in wiring material 2. Exposed portion 80 of conductive resin adhesive 14 exposed through this opening 70 can be visually recognized from the light-receiving surface side. Accordingly, by checking a color of exposed portion 80 through opening 70, curing of conductive resin adhesive 14 can be checked. In addition, a space between connection electrode 12B and wiring material 2 is filled up with conductive resin adhesive 14 without any gap, and the adhesive thus filled is then cured. Accordingly, by checking that conductive resin adhesive 14 is cured in exposed portion 80, the degree of bonding between connection electrode 12B and wiring material 2 can be checked. Note that similar to the above-described embodiment, notch 71 may also be provided in place of opening 70 in wiring material 2.

In addition, in the present embodiment, conductive resin adhesive 14 partially or entirely covers the upper surface and side surfaces on wiring material 2 side of connection electrode 12B. Thereby, connection electrodes 12B can be strengthened. In addition, conductive resin adhesive 14 may be formed so as to cross light-receiving surface 11A of photoelectric converter 11 and connection electrode 12B. With such configuration, bonding intensity between photoelectric converter 11 and connection electrode 12B can be increased, and thus a solar cell module with improved reliability can be obtained. Furthermore, bonding intensity between finger electrode 12A and photoelectric converter 11 can be increased by covering a region in a vicinity of corresponding connection electrode 12B in each of multiple finger electrodes 12A with conductive resin adhesive 14. Thereby, a solar cell module with further improved reliability can be provided.

In the above-described first to third embodiments, a connection between connection electrode 12B and wiring material 2 provided on the light-receiving surface side of photoelectric converter 11 has been described. Note, however, that the connection between connection electrode 12B and wiring material 2 provided on the back surface is not limited to this and various methods can also be employed.

Example

A method for manufacturing a solar cell module according to an example will be described below.

As the present example, solar cell modules according to the first to third embodiments are manufactured as follows. In the following manufacturing method, manufacturing processes will be described along with processes 1 to 4.

(Process 1) Formation of Photoelectric Converter

Firstly, an n-type single crystal silicon substrate with a resistivity of approximately 1 Ω·cm and a thickness of approximately 300 μm is prepared. In the n-type single crystal silicon substrate, impurities are removed by cleaning. Subsequently, an i-type amorphous silicon layer with a thickness of approximately 5 nm and a p-type amorphous silicon layer with a thickness of approximately 5 nm are formed in this order on the upper surface of the n-type single crystal silicon substrate by using an RF plasma CVD method.

Subsequently, an i-type amorphous silicon layer with a thickness of approximately 5 nm and an n-type amorphous silicon layer with a thickness of approximately 5 nm are formed in this order on the back surface of the n-type single crystal silicon substrate. Incidentally, these i-type amorphous silicon layer and n-type amorphous silicon layer are formed by processes similar to those of the above-described i-type amorphous silicon layer and p-type amorphous silicon layer, respectively.

After that, an ITO film with a thickness of approximately 100 nm is formed on each of the p-type amorphous silicon layer and the n-type amorphous silicon layer by a magnetron sputtering method.

With the processes described above, a photoelectric converter of a solar cell according to the present example is manufactured.

(Process 2) Formation of Power Collecting Electrode

Next, a power collecting electrode consisting of multiple finger electrodes 12A and connection electrodes 12B, for collecting current collected by finger electrodes 12A, is formed on the respective surfaces of the ITO films arranged on the light-receiving surface side and the back surface side of the photoelectric converter by a screen printing method. Finger electrodes 12A are formed by a method in which an epoxy-based thermoset-type silver paste is arranged so as to extend in parallel with each other with a predetermined gap.

With regard to samples according to the first to third examples, each of finger electrodes 12A is formed with a width of 100 μm, a thickness of 40 μm, and a pitch of 2 mm.

In addition, as the sample of the first example according to the first embodiment, a connection electrode with a width of approximately 1.5 mm and a thickness of approximately 50 μm is formed. As the sample of the second example according to the second embodiment, a connection electrode with a width of approximately 1.4 mm and a thickness of approximately 50 μm is formed. As the sample of the third example according to the third embodiment, a connection electrode with a width of approximately 1.2 mm and a thickness of approximately 50 μm is formed.

With regard to the samples of the first to third examples, connection electrode 12D and multiple finger electrodes 12C on the back surface side are arranged so as to be symmetric with connection electrode 12B and multiple finger electrodes 12A arranged on the light-receiving surface side of photoelectric converter 11, respectively.

(Process 3) Bonding of Wiring Material

Copper is used for wiring material 2, and its surface is covered with solder as wiring material 2. Subsequently, conductive resin adhesive 14 containing thermally thermosetting epoxy-based resin is coated on connection electrode 12B by a dispenser. This conductive resin adhesive 14 becomes red by curing. Incidentally, the volume fraction of nickel particles used in conductive resin adhesive 14 is approximately 5%.

Here, in the examples, conductive resin adhesive 14 is coated on the connection electrode so that conductive resin adhesive 14 would have a width of approximately 0.7 mm and a thickness of approximately 20 μm (example 1), a width of approximately 0.7 mm and a thickness of approximately 20 μm (example 2), and a width of approximately 1.2 mm and a thickness of approximately 20 μm (example 3), respectively.

After coating conductive resin adhesive 14 on both the light-receiving surface side and the back surface side, a tin plating copper foil of wiring material 2 is arranged on connection electrode 12B. Shapes of wiring materials 2 are respectively set to have a width of approximately 1.2 mm and a thickness of approximately 150 μm (example 1), a width of approximately 1.5 mm and a thickness of approximately 120 μm (example 2), and a width of approximately 1.5 mm and a thickness of approximately 120 μm (example 3). Then, a wiring material is arranged on the connection electrode provided on both surfaces of solar cell 1, which is sandwiched by a heating unit from upper and lower sides thereof to apply a predetermined pressure. At the same time, it is heated at a temperature of approximately 200° C. for one hour to cause conductive resin adhesive 14 to cure. Thereby, wiring material 2 is bonded to the connection electrode. By going through the above-described processes, the width of conductive resin adhesive 14 becomes 1.4 mm in all of the samples of the examples.

With regard to examples 2 and 3, opening 70 or notch 71 according to the first and second embodiments is provided in wiring material 2.

(Process 4) Modularization

An adhesive material formed of EVA3 is mounted on front surface protection member 4 formed of a glass substrate. Thereafter, solar cell 1 connected by wiring material 2 is arranged. After that, filler formed of EVA3 is further mounted thereon, and then back surface silicon 6 having three-layer structure of PET, aluminum foil, and PET is arranged. Subsequently, the above components are integrated by using a well-known laminating method to thereby manufacture a solar cell module according to the present example.

By going through such processes, the sample of the first example according to the first embodiment, the sample of the second example according to the second embodiment, and the sample of the third example according to the third embodiment are respectively formed.

Comparative Example

A sample of a comparative example is formed in the same method as those of the examples, excepting that a width and thickness of a connection electrode on a light-receiving surface side are respectively set to be approximately 1.5 mm and 50 μm, a width and thickness of a conductive resin adhesive are respectively set to be approximately 1.4 mm and 20 μm, and a width and thickness of a wiring material are respectively set to be approximately 1.5 mm and 120 μm. Note that the width of the conductive resin adhesive after the bonding of the wiring material is 1.7 mm.

Figure 20:
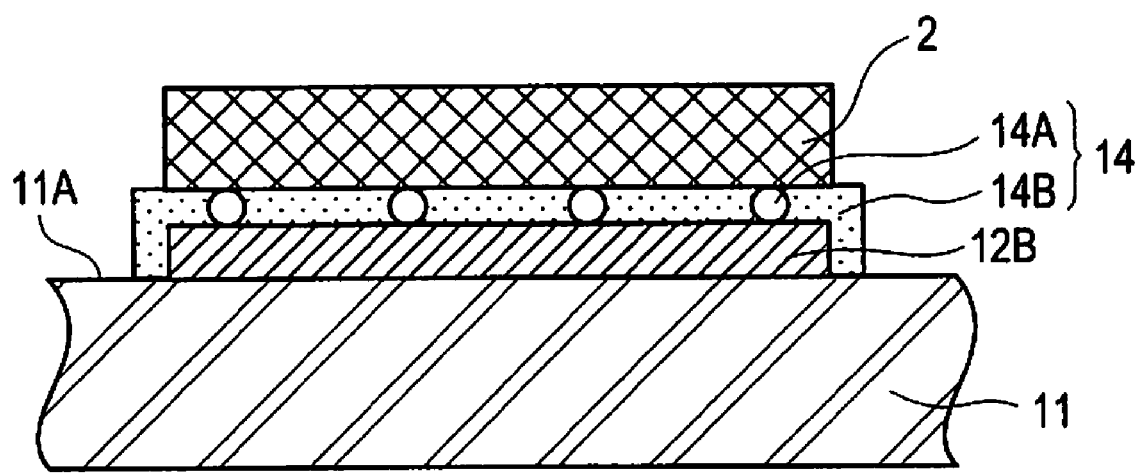
FIG. 20 is an enlarged plan view of essential parts of a connection relationship among a connection electrode, a conductive resin adhesive, and a wiring material of a solar cell module of a comparative example.

As a result, as shown in FIG. 20, a sample in which conductive resin adhesive 14 colored after being cured, protrudes to the light-receiving surface is formed.

Note that as to the dimension of the wiring material, cross-section areas of the wiring materials in the first to third examples and comparative example are set to be the same so that resistances of the wiring materials would be comparable.

In addition, with regard to the widths of the wiring material and connection electrode lessening the light-receiving area, the wider width between the widths of the wiring material and connection electrode is unified to 1.5 mm. Note that carriers generated in the photoelectric converter preferentially flows to the wiring material with smaller resistance, and thus differences in the widths of connection electrodes can be almost negligible.

(Results)

With regard to the samples of the first to third examples and the comparative example, outputs of the respective samples are measured under light irradiation with AM 1.5 and 100 mW/cm² by a solar simulator.

Table 1 shows standardized outputs of the solar cell modules of the comparative example and the first to third examples. The standardized output mean values and standardized by using an output of a solar cell module in the comparative example as one. In addition, table 1 also shows sizes of the wiring material, connection electrode, and conductive resin adhesive. As can be seen from table 1, higher outputs can be obtained from the solar cell modules of the first to third examples when compared with the solar cell module of the comparative example.

The reason why higher outputs can be obtained in the first to third examples is likely that the loss of the light-receiving area by the colored conductive resin adhesives is reduced in the first to third examples than in the comparative example.

In addition, coloring of the conductive resin adhesive by curing can be visually recognized easily from the light-receiving surface side through the exposed portion.

TABLE 1

|  |  | Comparative example | Example 1 | Example 2 | Example 3 |
|---|---|---|---|---|---|
| Connection electrode | Width [mm] | 1.5 | 1.5 | 1.4 | 1.2 |
|  | Thickness [μm] | 50 | 50 | 50 | 50 |
| Conductive resin adhesive | Width [mm] | 1.7 | 1.4 | 1.4 | 1.4 |
| Wiring material | Width [mm] | 1.5 | 1.2 | 1.5 | 1.5 |
|  | Thickness [μm] | 120 | 150 | 120 | 120 |
| Standardized outputs |  | 1.000 | 1.004 | 1.005 | 1.005 |

As has been described thus far, with the structures of the above-described examples, the decrease of outputs due to the decrease of the light-receiving area by the colored conductive resin adhesive can be prevented. In addition, the coloring of the conductive resin adhesive can be visually recognized from the upper surface of the solar cell, and thus the bonding of the wiring material and the connection electrode can be easily checked. Thereby, a solar cell module with improved performance and reliability can be manufactured.

The invention includes other embodiments in addition to the above-described embodiments without departing from the spirit of the invention. The embodiments are to be considered in all respects as illustrative, and not restrictive. The scope of the invention is indicated by the appended claims rather than by the foregoing description. Hence, all configurations including the meaning and range within equivalent arrangements of the claims are intended to be embraced in the invention.

What is claimed is:

1. A solar cell module comprising:
   a solar cell;
   a plurality of first connection electrodes provided on at least the light-receiving surface or back surface of the solar cell;
   a plurality of conductive resin adhesives arranged on a first conductive adhesive contact surface side of the connection electrodes; and
   a plurality of second wiring materials having a second conductive adhesive contact surface side arranged over and bonded to the connection electrodes by the conductive resin adhesives so as to be electrically connected to the solar cell, wherein
   the conductive adhesives cover wider than one of the first and second conductive adhesive contact surface sides while covering narrower than the other conductive adhesive contact surface side wherein the wiring materials are wider than the connection electrodes.

2. The solar cell module of claim 1, wherein the conductive resin adhesives cover wider than part of the second wiring materials.

3. The solar cell module of claim 1, wherein the conductive resin adhesives cover the connection electrodes including the side edges.

4. The solar cell module of claim 1, wherein the wiring material has openings within that expose the conductive resin adhesives.

5. The solar cell module of claim 1, wherein the wiring material has a notch that exposes the conductive resin adhesives.

6. The solar cell module of claim 4, wherein the conductive resin adhesives completely fill the openings within the wiring material.

7. The solar cell module of claim 6, wherein the conductive resin adhesives cover only part of the connection electrode.

8. The solar cell module of claim 6, wherein the conductive resin adhesives are arranged to protrude from the wiring material within a surface on the wiring material side of the connection electrode.

9. A solar cell module comprising:
- a solar cell;
- a plurality of first connection electrodes provided on at least the light-receiving surface or back surface of the solar cell;
- a tape conductive resin adhesive arranged on a first conductive adhesive upper contact surface side of the connection electrodes; and
- a plurality of second wiring materials having a second conductive adhesive contact surface side arranged over and bonded to the connection electrodes by the tape conductive resin adhesive so as to be electrically connected to the solar cell, wherein the tape conductive resin adhesive completely covers one of the first and second conductive adhesive contact surface sides without completely covering the other conductive adhesive contact surface side wherein the wiring materials are wider than the connection electrodes.

10. The solar cell module of claim 9, wherein the tape conductive resin adhesive completely covers part of the second wiring materials connection electrode.

11. The solar cell module of claim 9, wherein the tape conductive resin adhesive completely covers the connection electrodes including the side edges.

12. The solar cell module of claim 9, wherein the wiring material has openings within that expose the tape conductive resin adhesive.

13. The solar cell module of claim 9, wherein the wiring material has a notch that exposes the tape conductive resin adhesive.

14. The solar cell module of claim 12, wherein the tape conductive resin adhesive completely fills the openings within the wiring material arranged within a surface on the connection electrode side of the wiring material and covers side surfaces of the connection electrode.

15. The solar cell module of claim 14, wherein the tape conductive resin adhesive covers only part of the connection electrode.

16. The solar cell module of claim 14, wherein the tape conductive resin adhesive is arranged to protrude from the wiring material within a surface on the wiring material side of the connection electrode.

17. The solar cell module of claim 1, wherein the first conductive adhesive contact surface side of the connection electrodes, and the second wiring materials having a second conductive adhesive contact surface side are electrically connected to each other by a thickness of one to several conductive particles of the conductive adhesives.

* * * * *